United States Patent [19]

Truskalo

[11] 4,254,366
[45] Mar. 3, 1981

[54] REGULATED DEFLECTION CIRCUIT

[75] Inventor: Walter Truskalo, Titusville, N.J.

[73] Assignee: RCA Corporation, New York, N.Y.

[21] Appl. No.: 73,040

[22] Filed: Sep. 6, 1979

[51] Int. Cl.³ .............................................. H01J 29/70
[52] U.S. Cl. ..................................... 315/400; 315/411
[58] Field of Search .................................. 315/400, 411

[56] References Cited

U.S. PATENT DOCUMENTS

| 3,760,222 | 9/1973 | Smith | 315/400 X |
| 4,101,815 | 7/1978 | Willis | 315/411 |
| 4,147,964 | 4/1979 | Luz et al. | 315/411 |
| 4,176,304 | 11/1979 | Scott | 315/411 |

FOREIGN PATENT DOCUMENTS 2202912  8/1972  Fed. Rep. of Germany ............ 315/411

*Primary Examiner*—Malcolm F. Hubler

*Attorney, Agent, or Firm*—Eugene M. Whitacre; William H. Meagher; Joseph J. Laks

[57] ABSTRACT

Serially coupled first and second capacitors are charged from a DC source of unregulated input voltage through the primary winding of a flyback transformer of a horizontal deflection circuit. The voltage across the first capacitor is established as the voltage difference between the input voltage and the voltage across the second capacitor. The first capacitor functions as a trace capacitor for a horizontal deflection winding. A switch couples a trace voltage to the horizontal deflection winding to generate a trace deflection current. The switch also couples a first winding of a saturable reactor to the second capacitor to provide a capacitor discharge current path. A bias current flowing in a second winding of the saturable reactor varies the effective inductance of the first winding in response to energy level changes in the deflection circuit to control the voltage across the second capacitor.

7 Claims, 4 Drawing Figures

REGULATED DEFLECTION CIRCUIT

BACKGROUND OF THE INVENTION

This invention relates to regulated deflection circuits for television receivers, for example.

In typical television receiver circuitry, the horizontal deflection winding and a trace capacitor are series coupled. The trace capacitor is charged to a trace voltage from a B+ voltage supply through a flyback transformer primary winding. A trace switch then couples the trace capacitor to the deflection winding and applies the capacitor voltage across the winding to generate a trace deflection current. During retrace, the trace switch is nonconductive and the deflection winding and flyback transformer primary winding resonate with a retrace capacitor to generate retrace pulse voltages in the two windings.

During retrace, the deflection current reverses in direction preparatory to starting the next deflection interval. The retrace pulse voltage in the flyback transformer primary winding is stepped up by a high voltage winding to generate the high voltage or ultor accelerating potential.

To maintain a constant raster width, the trace voltage developed across the deflection winding and the retrace pulse voltages are regulated. To achieve this result, conventional television receiver regulators, using controllable semiconductor switching elements, develop a regulated B+ supply voltage derived from an unregulated input voltage, such as a voltage derived from the AC line or mains supply. For greater efficiency, such switching elements typically operate at the relatively high frequencies of 16 or 20 kilohertz.

Other television receiver regulators such as described in the U.S. patent application of D. H. Willis, Ser. No. 058,659, filed July 19, 1979, a continuation of Ser. No. 926,337, filed July 20, 1978, now abandoned; both applications being entitled "*REGULATED DEFLECTION CIRCUIT WITH REGULATOR SWITCH CONTROLLED BY DEFLECTION CURRENT*", couple the unregulated input voltage to the flyback transformer primary winding and to the deflection winding and trace capacitor. A second capacitor is coupled to the trace capacitor and is charged to a voltage which follows the input voltage variations. The trace voltage, established as the difference between the input voltage and the second capacitor voltage, is thereby regulated. The charge-discharge cycle of this second capacitor occurs at the 16 kilohertz frequency of horizontal deflection.

Controllable semiconductor switching elements used in the above-described regulator circuits may be relatively expensive, may be subject to switching failure, and may require relatively complex control circuitry. It is desirable to design a regulator circuit which operates at the higher frequencies of the above-described circuits, but which does not require controllable semiconductor switching elements to perform the regulation.

SUMMARY OF THE INVENTION

A trace and second capacitor are charged from a source of unregulated voltage. A switch couples a deflection winding to at least one of the two capacitors in order to apply a trace voltage to the deflection winding to generate a trace current. The switch also couples a first saturable reactor winding to the second capacitor for controlling the voltage across the second capacitor. The trace voltage is established at a value which represents the difference between the unregulated voltage and the voltage maintained across the second capacitor. A control circuit, responsive to changes in a deflection circuit energy level, generates a bias current in a second saturable reactor winding for varying the current flow in the first saturable reactor winding and the voltage across the second capacitor for regulating the deflection circuit.

DESCRIPTION OF THE INVENTION

Figure 1:
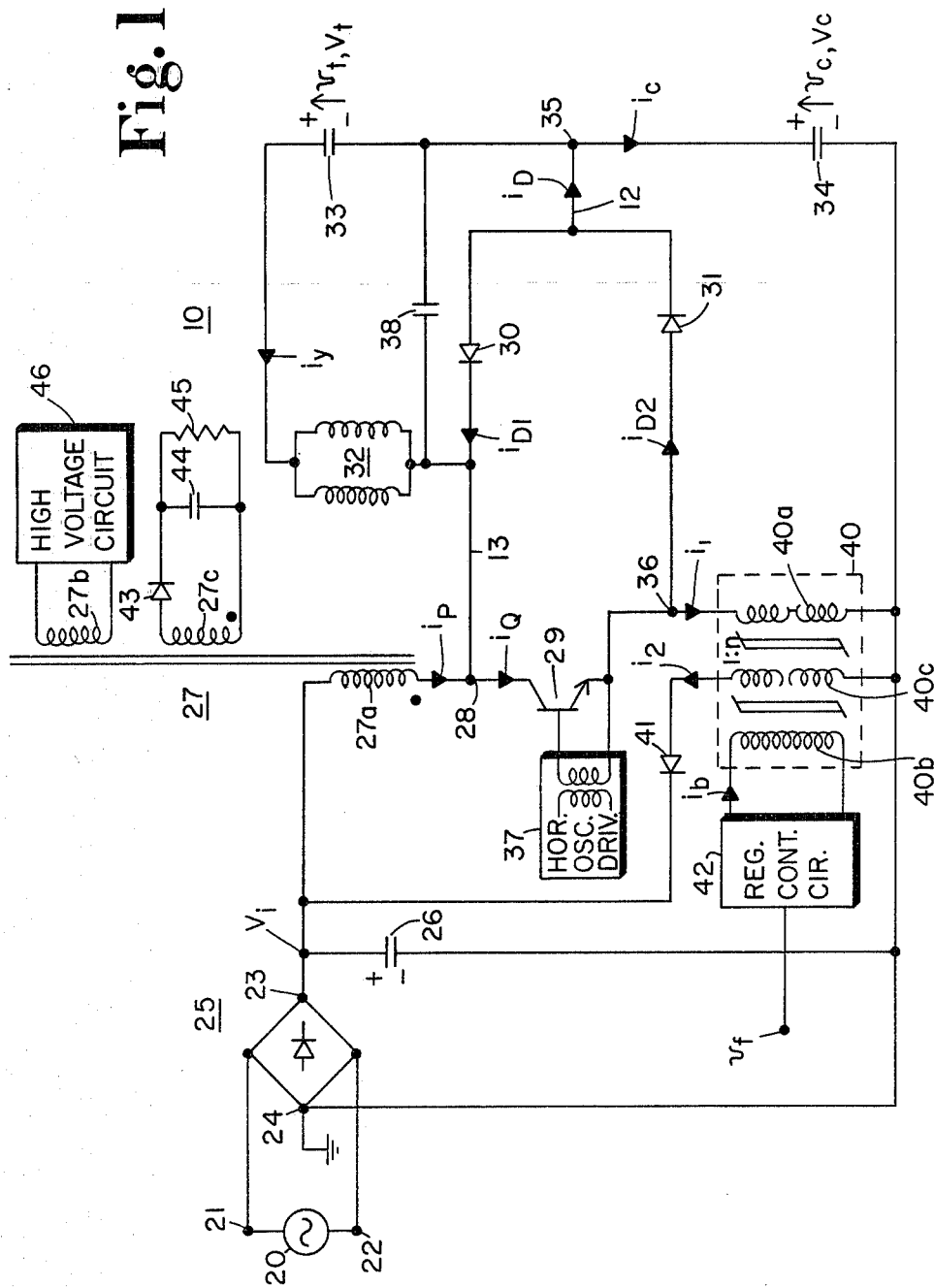
FIG. 1 illustrates a regulated deflection circuit embodying the invention.

In regulated horizontal deflection circuit 10, illustrated in FIG. 1, a 120 volt, 60 Hertz AC line or mains supply 20 is coupled across input terminals 21 and 22 of a full-wave bridge rectifier 25. One terminal of a filter capacitor 26 is coupled to an output terminal 23 of rectifier 25, the other terminal of capacitor 26 is coupled to a ground or current return terminal 24. A filtered but unregulated DC input voltage $V_i$ is developed at terminal 23 relative to terminal 24.

The input voltage $V_i$ is coupled through a primary winding 27a of a horizontal output or flyback transformer 27 to a terminal 28 at the collector of a horizontal output transistor 29. Coupled between terminal 28 and a terminal 35 is the series arrangement of a horizontal deflection winding 32 and an "S" shaping or trace capacitor 33. Both a damper diode 30 and a retrace capacitor 38 parallel the series arrangement of deflection winding 32 and trace capacitor 33. A conventional horizontal oscillator and driver circuit 37 applies a conventional square-wave drive signal across the base and emitter electrodes of horizontal output transistor 29 to turn the transistor on at a selected instant prior to the center of the horizontal trace interval and to later turn off the transistor to initiate the horizontal retrace interval.

The emitter of horizontal output transistor 29 is coupled to terminal 35 through a diode 31. One terminal of a capacitor 34 is coupled to trace capacitor 33 at junction terminal 35. The other terminal of capacitor 34 is coupled to ground or current return terminal 24.

A high voltage secondary winding 27b of flyback transformer 27 is coupled to a conventional high voltage circuit 46 to produce an ultor accelerating potential. The voltage across secondary winding 27c is rectified during the horizontal trace interval by a diode 43 and filtered by a capacitor 44 to provide an auxiliary DC supply voltage to various television receiver load circuits, such as the vertical deflection circuit, illustrated generally in FIG. 1 as a resistor 45. Auxiliary DC supply voltages derived by rectification of retrace pulses developed in flyback transformer secondary windings may also be provided but are not illustrated in FIG. 1. The reflected load currents of the high voltage and auxiliary supplies impose a DC component onto the current flowing in primary winding 27a.

The emitter of horizontal output transistor 29 is coupled to ground through a first winding 40a of a saturable reactor regulator 40. A second winding 40c of saturable reactor regulator 40 is coupled from ground through a diode 41 to terminal 23.

A regulator control circuit 42, responsive to an applied feedback voltage $v_f$, generates a bias current $i_b$ in a control winding 40b of saturable reactor 40. The bias current produces a bias flux in the core of saturable reactor 40 which controls the inductance of and current flow in windings 40a and 40c in a manner to be further explained.

During a start-up interval, after the mains supply voltage is first applied between terminals 21 and 22, input voltage $V_i$ is developed across capacitor 26 and current begins to flow from terminal 23 through flyback primary winding 27a to charge the serially coupled trace capacitor 33 and capacitor 34. Horizontal oscillator and driver 37 switches conduction of transistor 29 each deflection cycle so as to generate a horizontal trace current in deflection winding 32 during the horizontal trace interval and a horizontal retrace pulse voltage in retrace capacitor 38 and a retrace current in deflection winding 32 during the horizontal retrace interval.

As capacitors 33 and 34 continue to charge, the peak-to-peak horizontal trace current and the retrace pulse voltage amplitude continues to increase until a steady state or equilibrium trace voltage $v_t$ is established across trace capacitor 33 and a steady state voltage $v_c$ is developed across capacitor 34.

The peak-to-peak trace current in deflection winding 32 and the retarce pulse amplitudes in deflection winding 32 and in the windings of flyback transformer 27 are a function of the DC or average value $\overline{v}_t$ of the trace voltage $v_t$. Thus, by regulating the trace voltage, raster width and high voltage are also regulated.

The voltage $v_c$ across capacitor 34 and the DC or average value $\overline{v}_c$ of the voltage $v_c$ are controlled by the operation of saturable reactor regulator 40, as will hereinafter be explained. The DC value of the trace voltage is constrained to assume a voltage equal to the algebraic difference between the unregulated DC input voltage $V_i$ and the DC voltage $\overline{v}_c$ across capacitor 34. Therefore, to maintain the DC value of the trace voltage constant with variations in the input voltage $V_i$, the DC voltage across capacitor 34 is made to follow the input voltage variations. An increase in the input votlage, for example, will result in an increase in the voltage across capacitor 34, thereby maintaining a constant average trace voltage.

For the purposes of explaining operation of regulated deflection circuit 10 including operation of saturable reactor regulator 40, certain simplifying assumptions are made. The voltages across capacitors 33 and 34 are considered as DC voltages $V_t$ and $V_c$ equal to the average DC voltages $\overline{v}_t$ and $\overline{v}_c$, respectively, with $V_t$ and $V_c$ changing little during a given horizontal deflection cycle. The deflection current $i_y$ flowing in horizontal deflection winding 32, illustrated in FIG. 2a, comprises a positive-going sawtooth current during the horizontal trace interval $t_2-t_7$, reaching a peak amplitude $I_p$ at the end of trace, and comprises a negative-going sawtooth current during the horizontal retrace interval $t_0-t_2$. Flyback transformer 27 is considered to function as a current source to provide a primary current $i_p = I_0$, a constant load current with a magnitude that is determined by the loading on the flyback transformer secondary windings 27b and 27c.

Figure 2:
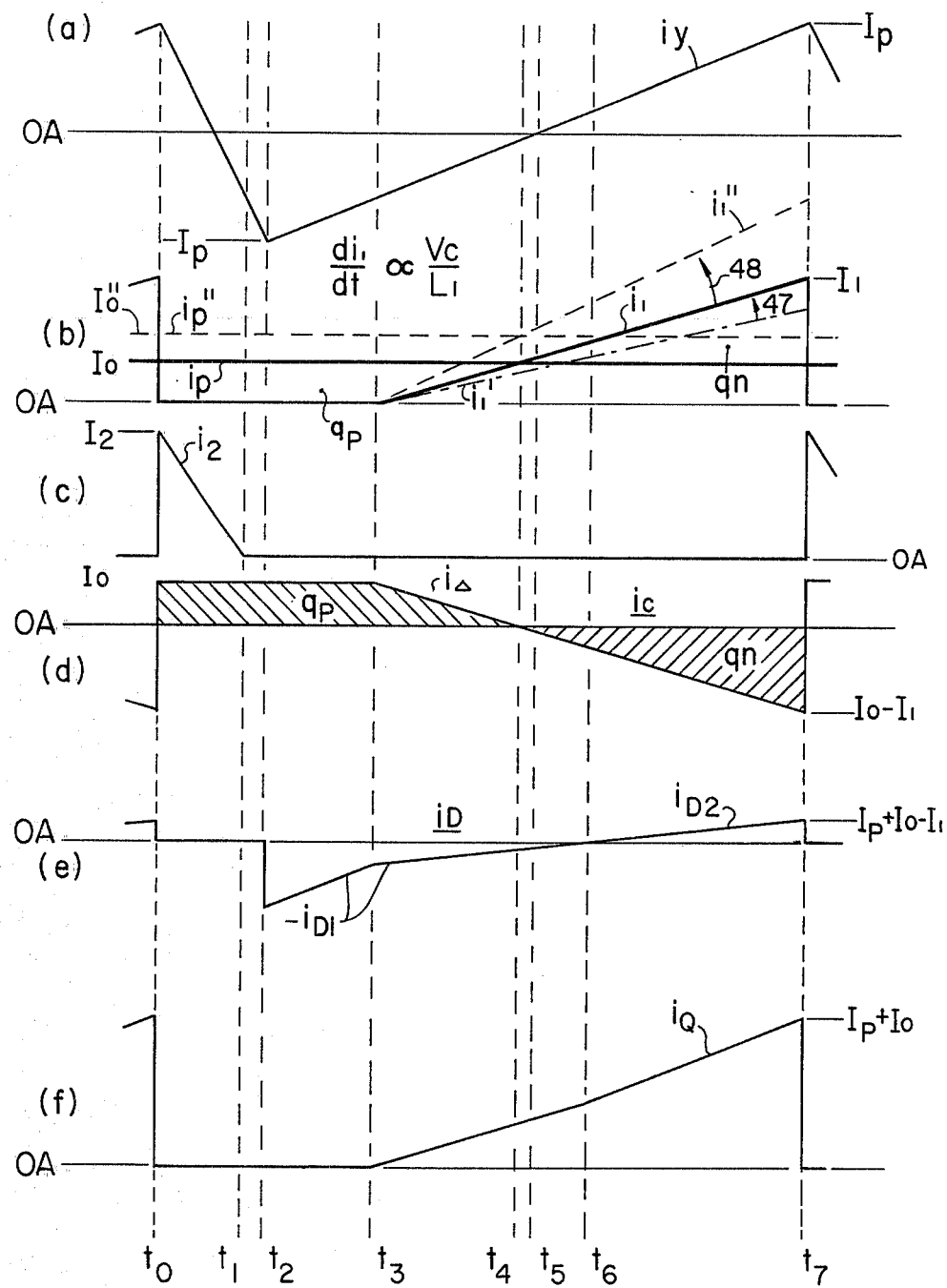
FIG. 2 illustrates waveforms associated with the circuit of FIG. 1.

At the beginning of the horizontal trace interval, near time $t_2$ of FIG. 2a, deflection current $i_y$ has reached a value $-I_p$. The voltage across retrace capacitor 38 is near zero with the electrode of capacitor 38 that is coupled to terminal 28 at a voltage that is sufficiently negative with respect to the voltage at the other electrode at terminal 35 to forward bias damper diode 30 into conduction. Damper diode 30 couples capacitor 33 across deflection winding 32, thereby applying the trace voltage $V_t$ to the deflection winding and generating the trace sawtooth deflection current $i_y$ in the winding.

With terminals 28 and 35 coupled together by means of damper diode 30, the flyback transformer primary winding 27a becomes coupled to capacitor 34. The primary winding current $i_p$ may be considered as flowing through damper diode 30, subtracting from the deflection winding current flowing in the diode. Then the current $i_p$ flows through a conductor line 12 connecting the junction of the anode of damper diode 30 and the cathode of diode 31 to terminal 35. A current $i_c$, equal in magnitude to the primary winding current of $I_0$ flows in capacitor 34 between times $t_2-t_3$ and charges the capacitor, as illustrated in FIG. 2d. It should be noted that when flyback transformer 27 is considered a constant current source, this current source charges capacitor 34 during horizontal retrace also, as illustrated in FIG. 2d between times $t_0-t_2$. The current $i_D$ flowing in conductor line 12 during this interval equals $i_p+i_y$, identical in magnitude to that of the damper diode current, $i_{D1}$, as illustrated in FIG. 2e.

At time $t_3$, the square-wave signal that is applied to the base of horizontal output transistor 29 by horizontal oscillator and driver 37, turns on the transistor into saturated conduction. A collector current $i_Q$ flows, as illustrated in FIG. 2f. With transistor 29 conducting, terminal 36 is coupled to terminal 35 by way of damper diode 30 and the collector-emitter path of transistor 29. The voltage $V_c$ of capacitor 34 is thus periodically applied across winding 40a of saturable reactor 40. A sawtooth current $i_1$ begins to flow in winding 40a, as illustrated in FIG. 2b. The slope of this sawtooth current is proportional to $V_c/L_1$, where $L_1$ is the effective inductance of winding 40a as established by the bias current $i_b$ flowing in control winding 40b.

Between times $t_3-t_4$, the primary current $i_p$ is greater than the saturable reactor winding current $i_1$. A portion of this primary winding current flows as the current $i_1$ from terminal 28, through transistor 29 into winding 40a. The difference between the two currents flows as a current $i_\Delta = i_p - i_1$ from terminal 28 through conductor line 13, damper diode 30, conductor line 12 and terminal 35 to charge capacitor 34, as illustrated in FIG. 2d by current $i_c$ between times $t_3-t_4$. At time $t_4$, the difference current $i_\Delta = 0$, because the saturable reactor winding current $i_1$ equals the primary winding current. Thus, at time $t_4$, no capacitor current $i_c$ flows. After time $t_4$, the saturable reactor winding current $i_1$ is greater than the primary current $i_p$ and the difference current $i_\Delta$ is negative, indicative of a negative current $i_c$ which discharges capacitor 34, as illustrated in FIGS. 2b and 2d.

At time $t_5$, deflection current $i_y$ reverses direction and becomes increasingly positive. Damper diode 30, however, still conducts the deflection current $i_y$, because the total current $i_D$ flowing in conductor line 12 is negative until time $t_6$, as illustrated in FIG. 2e. After time $t_3$ when transistor 29 turns on and saturable reactor winding current $i_1$ begins to flow, the current $i_D = i_y + i_\Delta$. Thus, if the sum $i_y + i_\Delta$ is negative, as it is between times $t_3-t_6$, the current $i_D$ flows as a current $-i_{D1}$ in damper diode 30 and, if the sum $i_y + i_\Delta$ is positive, current $i_D$ flows in diode 31. After time $t_6$, the positive deflection current $i_y$ has increased sufficiently to be greater in magnitude than that of the negative difference current $i_\Delta$. The current $i_D$ now flows as a current $i_{D2}$ in diode 31 which conducts between time $t_6$ and time $t_7$, the beginning of retrace.

As a requirement of a properly designed deflection circuit, the trace voltage $V_t$ should be applied across the horizontal deflection winding during the entire trace interval. For the circuit of FIG. 1, at each instant of the trace interval $t_2-t_7$, either damper diode 30 conducts or horizontal output transistor 29 and diode 31 simultaneously conduct, thereby coupling terminals 28 and 35 together and satisfying the above requirement.

With terminals 28 and 35 coupled together for the entirety of the trace interval, the voltage developed across flyback primary winding 27a during this interval is the regulated voltage or the voltage difference between the input voltage $V_i$ and the voltage across capacitor 34. Because the peak retrace voltage in primary winding 27a and thus the high voltage is a function of this regulated voltage, a feedback voltage $v_f$ which is representative of the retrace pulse amplitude may be applied to regulator control circuit 42 in order to regulate the high voltage.

At time $t_7$, the beginning of horizontal retrace, transistor 29 becomes nonconductive. The sawtooth saturable reactor current in winding 40a has increased to a peak value of $I_1$. After time $t_7$, a second reactor winding 40c and a diode 41 will provide for recovery into filter capacitor 26 of the energy stored in reactor 40 at the beginning of retrace, as represented by the peak current $I_1$, as illustrated in FIG. 2b, at time $t_7$. To maintain magnetic flux continuity in the core of saturable reactor 40 at the beginning of retrace when current $i_1$ ceases to flow due to the nonconduction of transistor 29, an induced voltage is developed across reactor winding 40c, forward biasing diode 41. A decreasing sawtooth current $i_2$ flows in reactor winding 40c beginning at the start of retrace at time $t_0$, as illustrated in FIG. 2c. At time $t_1$, current $i_2$ has decreased to zero, thereby returning to capacitor 26 substantially all the energy that was stored in reactor 40 at the beginning of retrace. The peak magnitude $I_2$ is a function of the turns ratio n of winding 40a to winding 40c. The slope of the current $i_2$ is proportional to the input voltage $V_i$ and inversely proportional to the inductance of reactor winding 40c as established by the bias current $i_b$ flowing in control winding 40b.

To provide trace voltage regulation, for example, the voltage $V_c$ across capacitor 34 is made to follow input voltage variations such that the algebraic difference between the input voltage and the voltage across capacitor 34 is maintained constant. In the steady state or equilibrium operating condition of regulated deflection circuit 10, the average value of the current $i_c$ flowing in capacitor 34 is zero. In each horizontal deflection cycle, the amount of charge $q_p$ which flows into capacitor 34 from terminal 35 equals the amount of charge $q_n$ which flows away from capacitor 34 into terminal 35. As illustrated in FIG. 2d, the area under the curve $i_c$ between times $t_0-t_4$, represented by the charge $q_p$, equals the area under the curve $i_c$ between times $t_4-t_7$, represented by the charge $q_n$. Alternatively illustrated in FIG. 2b, the area $q_p$ between the curve $i_p$ and $i_1$ during the interval $t_0-t_4$ equals the area $q_n$ between the two curves during the interval $t_4-t_7$.

Should the actual slope of the saturable reactor winding current be shallower, for example, than the slope of waveform $i_1$ during any given deflection cycle, for a given load current, a nonequilibrium condition results. Such a shallow slope current is illustrated in FIG. 2b by the dotted-dashed line $i_1'$. This shallow slope current may arise during the start-up interval when the voltage across capacitor 34 is less than that of the capacitor's steady state voltage.

From FIG. 2b, one notes that in this non-equilibrium condition, the total charge added to capacitor 34 during a deflection cycle is greater than the total charge removed during the same cycle. The voltage across capacitor 34 begins to rise and the slope of the current in saturable reactor winding 40a begins to increase, as indicated by the arrow 47, until equilibrium is reached at the correct capacitor voltage $V_c$ for a given load current $I_0$ and effective inductance $L_1$ of winding 40a.

The capacitance value of capacitor 34 has relatively little influence as to the voltage $V_c$ that will be established across the capacitor at equilibrium, the voltage $V_c$ being, in part, a function of $I_0$ and $L_1$. Similarly, the value of trace capacitor 33 has relatively little influence as to the average DC or trace voltage $V_t$ that will be established across the trace capacitor, the voltage being the difference between the input voltage $V_i$ and the voltage $V_c$.

The DC path for the flow of current from terminal 28 is through saturable reactor winding 40a. The average value of saturable reactor current $i_1$ must therefore substantially assume the average value $I_0$ of the load current component of the flyback transformer primary winding current. Because the average saturable reactor winding current is a function of the voltage $V_c$ applied across winding 40a by capacitor 34 during conduction of horizontal output transistor 29, the magnitude of the voltage $V_c$ at equilibrium is, therefore, determined in part by the value of the load current $I_0$.

As the operating conditions of input voltage $V_i$ and load current $I_0$ change, regulator control circuit 42 varies the effective inductance $L_1$ of saturable reactor winding 40a. A capacitor charge altering current is established in winding 40a which maintains an equilibrium value for the voltage $V_c$ which will regulate or oppose undesired variations in a deflection circuit quantity or energy level, such as the trace voltage $V_t$ or the retrace pulse amplitude. Assume, for example, that the input voltage $V_i$ increases. The trace voltage $V_t$ will tend to increase. Control circuit 42 senses the trace voltage increase and causes the effective inductance of winding 40a to increase. The current flowing in saturable reactor winding 40a each deflection cycle decreases, causing an excess of charging current to flow into capacitor 34. The voltage $V_c$ across capacitor 34 increases until a new equilibrium value is reached which will maintain the trace voltage $V_t$ unchanged.

Similarly, assume, for example, that the flyback transformer primary winding load current increases to a value $i_p'' = I_o''$, as illustrated by the dashed line in FIG. 2b. Since the current $i_1$ is a function of $V_c/L_1$, an excess of charging current begins to flow into capacitor 34 each deflection cycle, tending to cause the capacitor voltage $V_t$ to decrease. Control circuit 42 senses the decrease in trace voltage and causes the effective inductance of saturable reactor winding 40a to decrease, permitting the saturable reactor winding current to increase and accommodate the increased load current flow without necessitating any substantial changes to the voltages $V_c$ and $V_t$. The current in saturable reactor winding 40a increases in the direction of the arrow 48 of FIG. 2b, resulting in the establishment of a great equilibrium current $i_1''$ at the lower effective inductance level but at substantially the same voltages $V_c$ and $V_t$.

Figure 3:
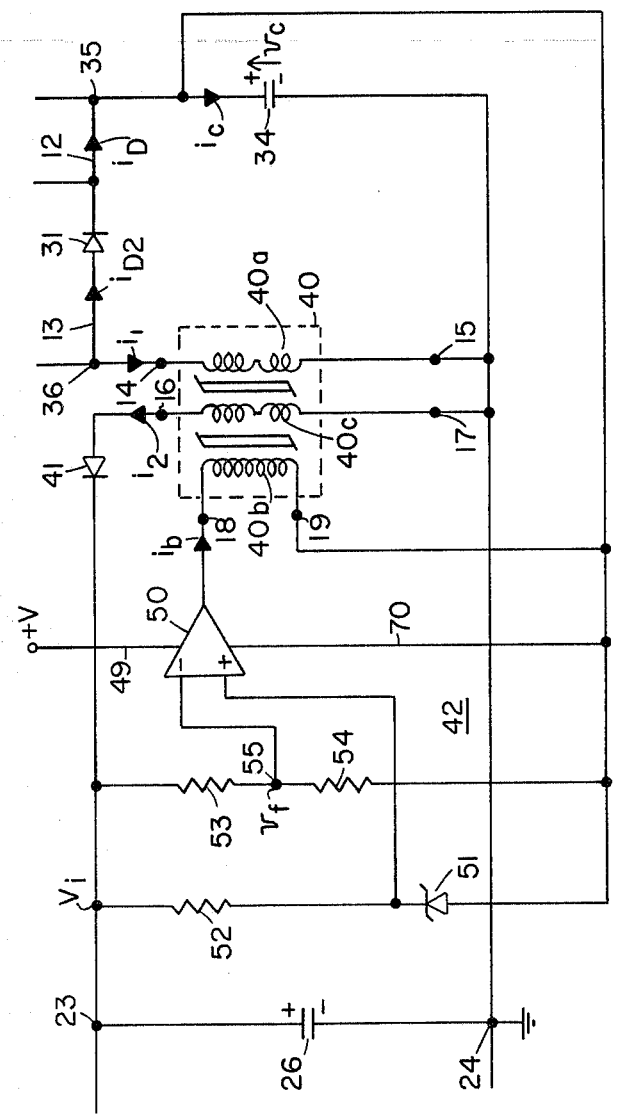
FIG. 3 illustrates a portion of the circuit of FIG. 1 with an embodiment of a regulator control circuit.

FIG. 3 illustrates a portion of regulated deflection circuit 10 that includes saturable reactor 40 and an embodiment of regulator control circuit 42. A bias current $i_b$, obtained at an output terminal of an amplifier 50, is coupled to a terminal 18 of control winding 40b of saturable reactor 40. Supply voltage for amplifier 50 is obtained through a conductor line 49 from an auxiliary +V voltage supply, with the ground reference for the +V supply being terminal 35. The ground reference for amplifier 50 is also terminal 35, as indicated by a conductor line 70 coupling the amplifier to terminal 35. A terminal 19 of control winding 40b is coupled to a reference zener diode 51. Supply current for zener diode 51 is obtained from terminal 23 through a resistor 52.

Voltage dividing resistors 53 and 54 are coupled between the two terminals 23 and 35, across which two terminals the trace voltage $V_t$ is developed. A feedback voltage $V_f$, representative of the trace voltage $V_t$, is developed at a terminal 55, the junction of resistors 53 and 54. This feedback voltage is applied to the inverting input terminal of amplifier 50. Should the trace voltage attempt to increase, for example, the bias current $i_b$ decreases, increasing the effective inductance of saturable reactor winding 40a, as is required in order to regulate the trace voltage.

Figure 4:
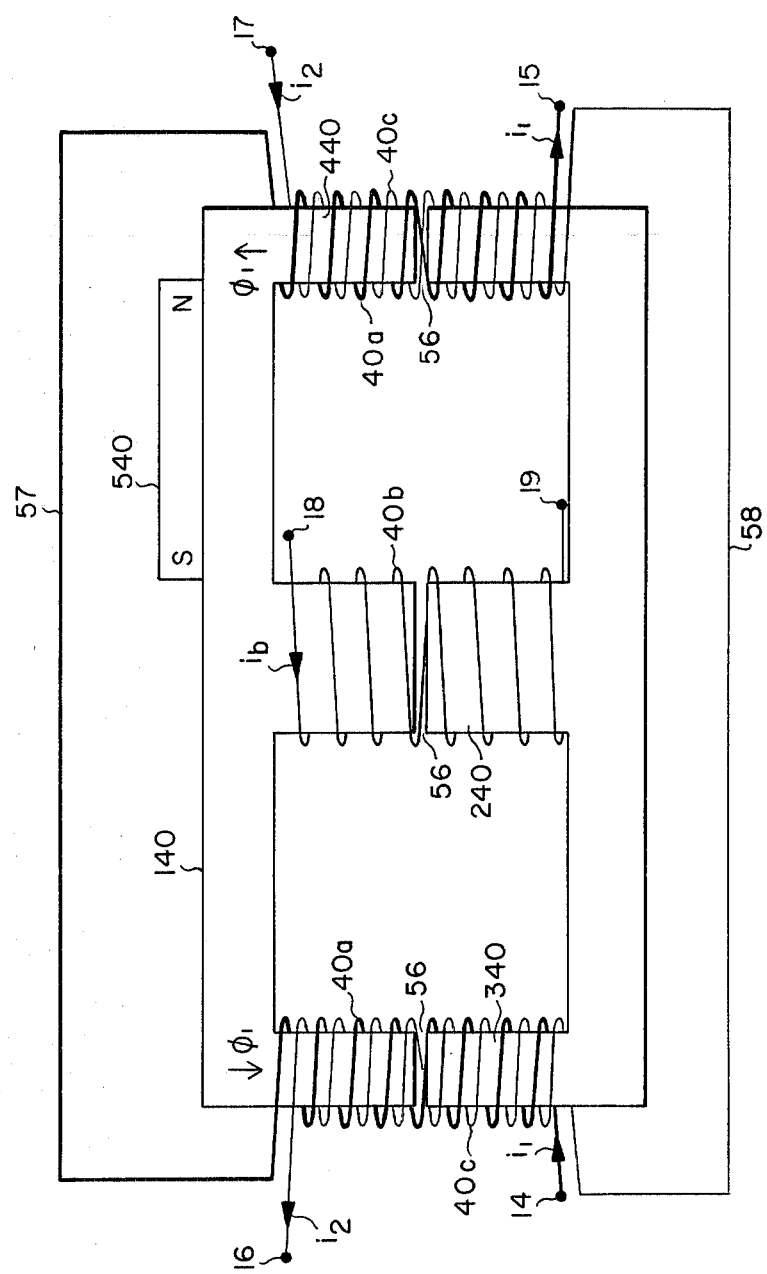
FIG. 4 illustrates schematically the winding and core structure of a saturable reactor used in the circuit of FIG. 1.

FIG. 4 schematically illustrates the magnetic core and winding structure of saturable reactor 40. The magnetic core of reactor 40 comprises a two-window core 140 with control winding 40b wound around the center leg 240. Saturable reactor winding 40a comprises two winding sections, with each section wound around a respective one of outer legs 340 and 440 of magnetic core 140. The two sections of winding 40a are series connected by a conductor 57. Saturable reactor winding 40c similarly comprises two winding sections, with each section wound around a respective one of outer legs 340 and 440. The two sections of winding 40c are series connected by a conductor 58.

Terminals 14 and 15 of winding 40a in FIG. 4 are coupled respectively to terminals 36 and 24 of FIG. 1 or 3, and terminals 16 and 17 of winding 40c are coupled respectively to the anode of diode 41 and terminal 35. Conductor 57 so connects the sections of winding 40a that when the current flows in winding 40a in the direction of the current arrow $i_1$ of FIG. 4, a flux $\phi_1$ is generated in core 140 which flows downward in left leg 340 and upward in right leg 440. Substantial $\phi_1$ flux cancellation occurs in center leg 240, thereby preventing the current $i_1$ from adversely affecting control circuit 42 and also preventing excessive, induced voltages from being developed in control winding 40b prior to core leg saturation. A bypass capacitor, not illustrated in FIG. 4, may be coupled across terminals 18 and 19 if desired. Conductor 58 so connects the sections of winding 40c that when current $i_1$ ceases to flow at the beginning of retrace, the voltage induced in winding 40c forward biases diode 41 of FIG. 1 or 3 into conducting a current that flows in winding 40c in the direction of the current arrow $i_2$ of FIG. 4.

Air gaps 56 may be provided in each of the legs of core 140. These gaps prevent core 140 from unduly magnetically saturating at relatively high reactor winding current levels, thereby increasing the regulation range provided by saturable reactor 40.

A further increase in regulation range may be obtained by providing a permanent magnet 540 in contact with the legs 240 and 440 as illustrated in FIG. 4. Magnet 540 introduces a bias flux into core 140 to counteract a shift in the core operating point produced by the DC components of the currents $i_1$ and $i_2$. Core 140 is thereby operated closer to the center portion of its B-H induction curve, providing for the increased regulation range.

What is claimed is:

1. A regulated deflection circuit, comprising:
   a source of unregulated voltage;
   a deflection winding;
   a trace capacitance coupled to said deflection winding;
   a second capacitance coupled to said trace capacitance and said source of unregulated voltage;
   means for charging said trace and second capacitances from said source of unregulated voltage;
   a saturable reactor, including first and second saturable reactor windings;
   switching means coupled to said deflection winding and to at least one of said trace and second capacitances for applying a trace voltage to said deflection winding to generate a trace deflection current in said deflection winding, said switching means coupling said first saturable reactor winding to said second capacitance for providing a path for current through said first saturable reactor winding to control the voltage across said second capacitance, said trace voltage being established at a value representative of the voltage difference between said unregulated voltage and the voltage maintained across said second capacitance; and
   control means coupled to said second saturable reactor winding and responsive to an energy level of said deflection circuit for generating a variable bias current in said second saturable reactor winding to control the current in said first saturable reactor winding for regulating said deflection circuit.

2. A circuit according to claim 1, including a flyback transformer, wherein said means for charging comprises a first flyback transformer winding, and wherein said deflection circuit includes means for imposing a variable load on said flyback transformer whereby the current flowing in said first flyback transformer winding includes a variable load current component.

3. A circuit according to claim 2 wherein said first flyback transformer winding is coupled to said first saturable reactor winding through said switching means.

4. A circuit according to claim 3, including a third saturable reactor winding coupled to a deflection circuit terminal that will provide recovery of the energy stored in said saturable reactor.

5. A circuit according to claim 4 wherein said trace and second capacitances are serially coupled, said switching means coupling said first flyback transformer winding and said first saturable reactor winding to a junction terminal of said trace and second capacitances.

6. A circuit according to claim 5 wherein, during equilibrium operating conditions of said deflection circuit, the average value of the current flowing through said first saturable reactor winding substantially assumes the average value of said load current component.

7. A regulated deflection circuit, comprising:
   a source of unregulated DC voltage;
   a deflection winding;
   a trace capacitance coupled to said deflection winding;
   a second capacitance coupled to said trace capacitance, the DC value of the voltage across said trace capacitance being constrained to assume a value representative of the voltage difference between said unregulated DC voltage and the DC value of the voltage across said second capacitance;
   a horizontal output device coupled to said deflection winding for applying a trace voltage to said deflection winding to generate a trace deflection current in said deflection winding;
   means including a flyback transformer winding coupled to said source of unregulated DC voltage and to said horizontal output device for charging said second capacitance from said source through said horizontal output device;
   a controllable inductance capable of being varied in effective inductance value;
   switching means coupled to said horizontal output device, controllable inductance and second capacitance for periodically applying the voltage developed across said second capacitance to said controllable inductance in order to establish a capacitance charge altering current in said controllable inductance; and
   means responsive to a quantity within said deflection circuit for varying the effective inductance value of said controlled inductance in order to control said charge altering current in said inductance in a sense opposing undesired variations in said quantity.

* * * * *